United States Patent [19]

McLaughlin et al.

[11] Patent Number: 4,696,097

[45] Date of Patent: Sep. 29, 1987

[54] POLY-SIDEWALL CONTACT SEMICONDUCTOR DEVICE METHOD

[75] Inventors: Kevin L. McLaughlin, Chandler; Thomas P. Bushey, Phoenix, both of Ariz.

[73] Assignee: Motorola, Inc., Schaumburg, Ill.

[21] Appl. No.: 785,414

[22] Filed: Oct. 8, 1985

[51] Int. Cl.[4] .................. H01L 21/283; H01L 21/302
[52] U.S. Cl. .................. 437/193; 148/DIG. 50; 148/DIG. 164; 148/DIG. 11; 156/653; 357/59; 357/34; 357/49; 437/228
[58] Field of Search .................. 29/576 W, 576 E; 148/DIG. 50, DIG. 164, DIG. 11; 156/653, 652; 357/34, 50, 59 H, 59 K, 59 J

[56] References Cited

U.S. PATENT DOCUMENTS

| | | | |
|---|---|---|---|
| 3,189,973 | 6/1965 | Edwards et al. | 29/576 E |
| 4,135,954 | 1/1979 | Chang et al. | 29/576 W |
| 4,324,038 | 4/1982 | Chang et al. | 29/591 |
| 4,481,706 | 11/1984 | Roche | 29/591 |
| 4,485,552 | 12/1984 | Magdo et al. | 29/591 |
| 4,589,193 | 5/1986 | Goth et al. | 29/576 W |

FOREIGN PATENT DOCUMENTS

| | | | |
|---|---|---|---|
| 3400295 | 7/1984 | Fed. Rep. of Germany | 357/34 |
| 0041511 | 11/1978 | Japan | 357/50 |
| 57-29203 | 9/1983 | Japan | 397/34 |
| 0117664 | 6/1985 | Japan | 357/34 |

OTHER PUBLICATIONS

Ghandhi, S. K., "VLSI Fabrication Principles", 1983, pp. 568-575.
Mader, S. R. et al, "Fabrication of Shallow Transistors", IBM Technical Disclosure Bulletin, vol. 27, #2, Jul. 1984, pp. 1303-1305.
Translation of Japanese Patent Laid-Open No. 126671/1984.
T. Nakamura et al., Self-Aligned Transistor with Sidewall Base Electrode", IEEE International Solid-State Circuit Conference, 2/20/81, pp. 214-215.
T. Nakamura et al., "Self-Aligned Transistor with Sidewall Base Electrode", IEEE Trans. on Electron Devices, vol. ED-29, No. 4, Apr. 1982, pp. 596-600.
T. Nakamura et al., "High Speed IIL Circuits Using a Sidewall Base Contact Structure," IEEE Jour. of Solid-State Circuits, vol. SC-20, No. 1, Feb. 1985, pp. 168-172.
D. D. Tang et al., "A Symmetrical Bipolar Structure," IEEE Electron Devices Meeting, Dec. 8-10, 1980, pp. 58-60.
C. Cohen, "Upwardly Operating Bipolar Transistors Increase Efficiency," Electronics, Sep. 22, 1982, pp. 85-86.

Primary Examiner—Brian E. Hearn
Assistant Examiner—Kevin McAndrews
Attorney, Agent, or Firm—Robert M. Handy

[57] ABSTRACT

Improved semiconductor devices having minimum parasitic junction area are formed by using multiple buried polycrystalline conductor layers to make lateral contact to one or more pillar-shaped epitaxial single crystal device regions. The lateral poly contacts are isolated from each other and from the substrate and have at least one polycrystalline pillar extending to upper surface of the device to permit external connections to the lower poly layer.

The structure is made by depositing three dielectric layers with two poly layers sandwiched in between. Holes are anisotropically etched to the lowest poly layer and the substrate. A conformal oxide is applied over the whole structure and anisotropically etched to remove the bottom portions in the hole where the poly pillar and the isolation wall are to be formed and isotropically where the single crystal pillar is to be formed. The remaining oxide regions isolate the buried conductor layers, contacts, and isolation walls. The polycrystalline pillar extending from the lowest poly layer to the device surface is formed at the same time as the epi-pillar. The structure may be made self-aligned and self-registering.

8 Claims, 29 Drawing Figures

POLY-SIDEWALL CONTACT SEMICONDUCTOR DEVICE METHOD

BACKGROUND OF THE INVENTION

1. Field of the Invention

This invention relates in general to electronic devices and, more particularly, to improved means and methods for providing small high performance devices with sidewall contacts, suitable for use in large scale integrated circuits.

2. Background Art

There is an ongoing desire in the semiconductor art to produce transistors having smaller and smaller dimensions. This is because, in many applications, faster performance, lower power dissipation, and/or more complex circuits can be obtained with smaller devices. It is generally also desired that the individual devices be electrically isolated one from the other With high speed low power bipolar transistors and integrated circuits, for example, the individual devices are usually isolated by a combination of junction isolation and oxide filled trenches in the semiconductor substrate. Typically, metallic interconnects are made to emitter, base, and collector contact regions on the upper surface of the active portions of the device. Minimum device size is usually limited by the minimum lithographic dimensions, the need for providing alignment tolerance among the successive mask layers, and the need for providing contacts on the device surface.

While the available device structures and methods permit very complex integrated circuits to be fabricated, they still suffer from a number of significant limitations. For example, in a typical planar bipolar transistor the base-collector junction area and the collector-substrate junction area are larger than is necessary merely for the desired transistor action because of the need to provide room on the upper surface of the device for the contact regions. These larger than desired junction areas can introduce unwanted parasitic capacitance which limits the device or circuit performance. The larger areas can also limit the attainable packing density and circuit complexity.

A partial solution to this problem has been suggested in the prior art by use of "pillar" transistors employing lateral polycrystalline base contacts. However, these prior art structures still suffer from excessive collector-substrate capacitance, are not easily interconnected because they have a substrate collector contact, and are difficult to fabricate. Thus, a need continues to exist for device structures and fabrication methods which overcome or avoid one or more limitations of the prior art.

Accordingly, it is an object of the present invention to provide improved means and methods for fabricating minimum geometry semiconductor devices which have reduced base-collector and collector-substrate junction areas.

It is an additional object of the present invention to provide improved means and methods for forming semiconductor devices in which electrical connections to the buried active device regions are made laterally.

It is a further object of the present invention to provide improved means and methods for forming bipolar transistors using buried sidewall contacts to base and collector regions.

It is additional object of the present invention to provide improved means and methods for providing device structures which can be individually isolated.

It is a further object of the present invention to provide improved means and methods for fabricating devices in which the device active areas, contacts, and isolation walls can be self-aligned and whose dimensions and separations can be controlled by a single masking layer.

It is an additional object of the present invention to provide improved means and methods for interconnecting devices and device regions using isolated buried conductor layers formed at the same time as the lateral device contacts.

As used herein, the words "polycrystalline" or "poly" are intended to include all non-single crystal forms of solids. As used herein, the words "dip etching" are intended to include all forms of blanket etching or erosion, and are not intended to be limited merely to wet chemical etching.

SUMMARY OF THE INVENTION

The attainment of the foregoing and other objects and advantages is achieved through the present invention wherein there is provided a process for forming sidewall contact semiconductor devices comprising: providing a semiconductor substrate having thereon superposed layers of a first dielectric, a first polycrystalline conductor, a second dielectric, a second polycrystalline conductor and a third dielectric, wherein the third dielectric has an outer surface; forming on the outer surface a first mask having first, second and third windows above first, second and third portions respectively of each of the substrate, the first, second and third dielectric layers and the first and second polycrystalline conductor layers; using the first, second and third windows of this first mask, removing first, second and third portions, respectively, of the third dielectric layer to create first second and third openings therein, respectively; forming a second mask covering the third opening, removing the first and second portions of the second polycrystalline conductor layer and second dielectric layer under the first and second openings; providing a third mask covering the second opening, removing the first portion of the first polycrystalline conductor layer and the first portion of the first dielectric layer under the first opening; removing any remaining parts of the first, second and third masks. At this point, first edge portions of the first and second polycrystalline conductor layers and the second and third dielectric layers are exposed beneath the first opening, the second portion of the first polycrystalline conductor layer and second edge portions of the second polycrystalline conductor layer and second and third dielectric layers are exposed beneath the second opening, and the third portion of the second polycrystalline conductor layer is exposed beneath the third opening.

Thereafter, conformally covering the structure with a fourth dielectric layer; covering the fourth dielectric layer with a fourth mask having a fourth opening encompassing the second opening; anisotropically etching the portion of the fourth dielectric layer exposed in the fourth opening so as to remove the portion of the fourth dielectric layer above the second portion of the first polycrystalline conductor layer while not substantially removing the portion of the fourth dielectric layer on the second edge portion of the second polycrystalline conductor layer; covering the fourth dielectric layer with a fifth mask having a fifth opening encompassing the first opening; isotropically etching the portion of the fourth dielectric layer exposed in the fifth opening so as to remove at least the portions of the fourth dielectric layer on the first edge portions of the first and second polycrystalline conductor layers and on the first portion of the substrate; then forming a single crystal semiconductor pillar above the first portion of the substrate and in contact with the first edge portion of the first and second polycrystalline conductor layers, and forming a polycrystalline conductor pillar above the second portion of the first polycrystalline conductor layer; forming a device in the single crystal semiconductor pillar; and providing electrical connections to the third portion of the second polycrystalline conductor layer, the single crystal semiconductor pillar and the polycrystalline pillar.

An NPN bipolar transistor is conveniently obtained, for example, by providing N-type doping in the lower portion of the single crystal pillar to form a collector (or emitter) in contact with the first polycrystalline conductor layer, providing P-type doping in the middle portion of the single crystal pillar to form a base in contact with the second polycrystalline conductor layer, and providing N-type doping at the upper surface of the single crystal semiconductor pillar to form an emitter (or collector). Lateral dielectric spacers are optionally provided at the periphery of the upper surface of the single crystal pillar so that the emitter (or collector) can be implanted centrally in the single crystal pillar without additional masking steps.

It is further convenient to provide an isolation region by including in the first mask a first isolation opening which desirably surrounds the device and the first, second and third openings. Additional isolation openings are provided in the second and third masks so as to encompass the first isolation opening, and fourth portions of the first and second polycrystalline conductor layers and first, second, and third dielectric layers are removed under the first isolation opening at the same time as the first portions of the same layers are removed, thereby exposing fourth edge portions of the same layers under the first isolation opening. The fourth edge portions are conformally covered by the fourth dielectric layer. An additional opening is optionally provided in the fourth mask so as to encompass the isolation opening and the fourth dielectric layer exposed therein is anisotropically etched without substantially removing the portion of the fourth dielectric layer covering the fourth edge portions. The isolation region is optionally filled with single crystal material during formation of the single crystal semiconductor pillar under the first opening or may be filled with a dielectric material.

The portions of the first and second polycrystalline conductor layers located between the isolated devices provide buried interconnections for wiring together the individual isolated devices and are conveniently formed simultaneously with the device pillar and sidewall contacts. A preferred embodiment uses a single masking layer to locate the active regions of the device, the contacts, the isolation regions surrounding the device, and the buried interconnection and contacts thereto. This is a substantial advantage. In another embodiment, contact to the second polycrystalline layer is formed by a separate, not selfaligned mask. The polycrystalline conductors are conveniently formed of silicon, but other semiconductors, silicides, intermetallics or combinations thereof can also be used. The polycrystalline conductors must withstand the processing necessary to form the single crystal pillar for the active device regions.

DETAILED DESCRIPTION OF THE DRAWINGS

For the purposes of explanation, the device structures illustrated herein are shown as bipolar devices having particular combinations of N and P layers. However, those of skill in the art will understand that these device structures and doped layer combinations are presented merely as an aid to understanding and are not intended to be limiting, and that other combinations of N and P layers or regions and other device types can equally well be used and fabricated according to the teachings of the present invention. The invented means and method applies to any structure requiring multiple sidewall contacts to device regions and/or multiple buried conductor layers for interconnection or other purposes.

Figure 1A:
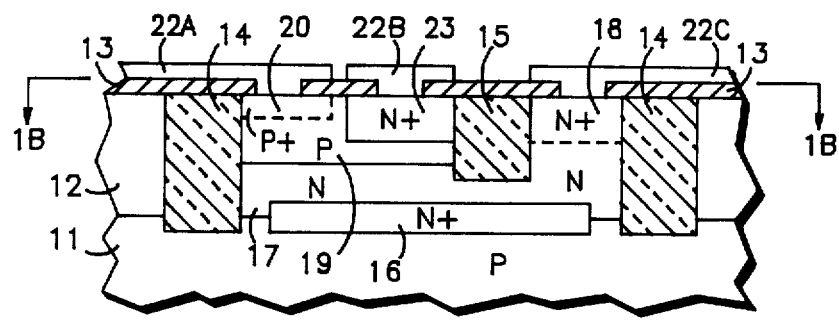
FIGS. 1A-C show simplified schematic cross-sectional side and top views of a portion of a semiconductor device accordingly to the prior art.
Figure 1B:
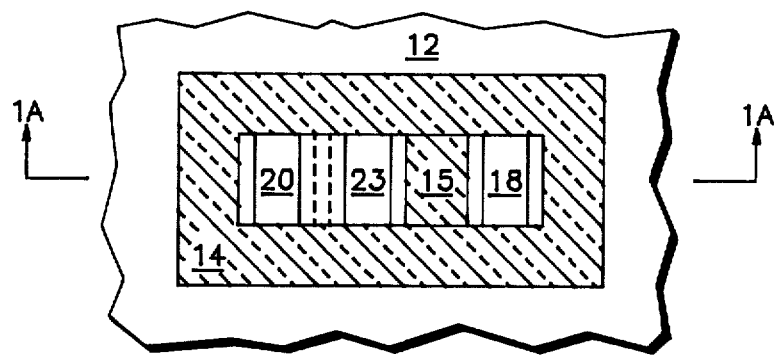

FIGS. 1A-B show in schematic form simplified cross-sectional side and plan views of a portion of a typical semiconductor device made according to the prior art. Semiconductor device portion 10 consists of P-type substrate 11 covered by epitaxial layer 12 and having buried N+ region 16, N-type collector region 17, P-type base region 19, N+ emitter region 23, N+ collector contact region 18, P+ base contact region 20 and dielectric layer 13. Dielectric layer 13 is transparent in FIG. 1B. Device portion 10 is surrounded by dielectric isolation wall 14. Collector contact region 18 is separated from emitter 23 by additional dielectric isolation wall 15. Electrical contacts 22a, 22b, and 22c are provided respectively, to base contact region 20, emitter region 23, and collector contact region 18. Means for constructing such devices are well known in the art.

Figure 1C:
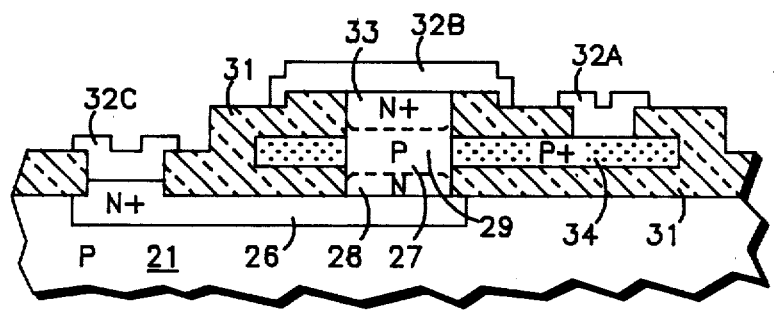

FIG. 1C shows a simplified schematic cross-sectional side view of another bipolar device structure known in the prior art. Device portion 30 consists of substrate 21 in which has been placed buried collector region 26. Dielectric layer 31 surrounds pillar-like single crystal device region 27 consisting of collector portion 28, base portion 29, and emitter portion 33. In contrast to the structure of device portion 10 of FIG. 1A, base portion 29 of device 30 of FIG. 1C does not extend directly to the upper surface of device 30. Rather, contact to base portion 29 is made by means of P+ polycrystalline conductor layer 34 which contacts base portion 29 of single crystal device region 27 at its lateral periphery or sidewall. Electrical contacts to device 30 are provided by metal 32a which contacts poly region 34, metal 32b which contacts emitter 33, and metal 32c which contacts buried collector region 26.

A deficiency of the structure of FIG. 1A is that extending the active base and collector regions to accommodate contacts on the upper surface increases the base-collector junction and the collector-substrate junction area. The structure of FIG. 1C provides some improvement since no additional base-collector junction area is needed to accommodate the base contact. However, the structure of FIG. 1C does not substantially reduce the collector-substrate junction area. Among other things, the larger collector-substrate junction area can degrade the device performance and increase device size. Further, isolation and step coverage are more difficult because the collector contact is on the substrate.

These and other problems are overcome by the structure of FIGS. 2A-D, according to the present invention. FIGS. 2A-D show simplified schematic cross-sections of device portion 40 comprising substrate 41 with superposed layers 42–46. Penetrating through layers 42–46 is single crystal pillar 49 in which has been formed, for example, N+ buried collector 49a, N-type collector region 49b, P-type base region 49c and N+ emitter region 49d. Electrical contacts to collector region 49a-b and base region 49c are made internally at the periphery or sidewall single crystal pillar 49 by poly regions 43 and 45, respectively. Poly regions 43 and 45 are isolated from substrate 41 and/or from each other by dielectric regions 42, 44, 47c and 59a. Also penetrating through layers 42–46 are single crystal or dielectric regions 59. Single crystal or dielectric regions 59 are separated from polycrystalline regions 43 and 45 by dielectric regions 59a. Regions 59-59a form the isolation wall surrounding device 40.

Polycrystalline collector contact 43 consists of comparatively thin lateral contact portion 47a which contacts single crystal device pillar 49 and polyycrystalline pillar portion 47b which connects lateral contact portion 47a to external collector contact 50c. Polycrystalline base contact region 45 consists of comparatively thin lateral contact portion 48a and, optional vertical portion 48b extending to external base contact 50a. Vertical portion 48b may be formed as a part of contact 50a (see for example region 96b of FIGS. 3I or 4I). External contact 50b contacts N+ emitter region 49d of single crystal device region 49.

Figure 2A:
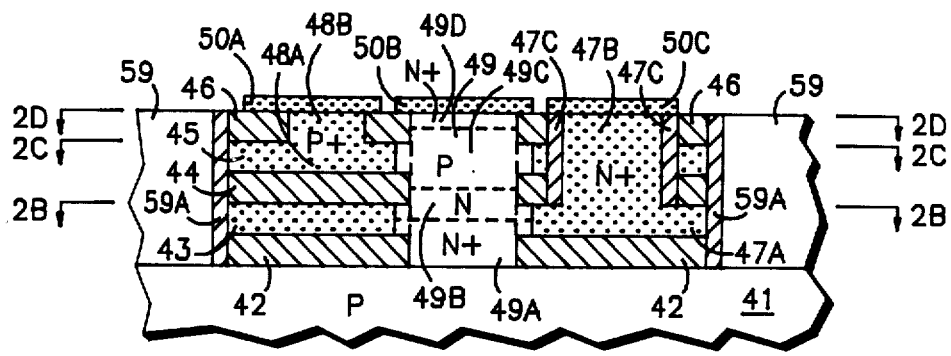
FIGS. 2A-D show simplified schematic cross-sectional side and plan views of a portion of a semiconductor device according to the present invention.
Figure 2B:
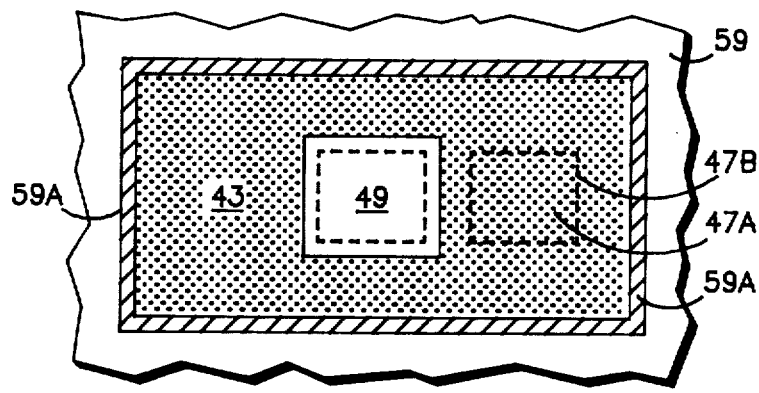
Figure 2C:
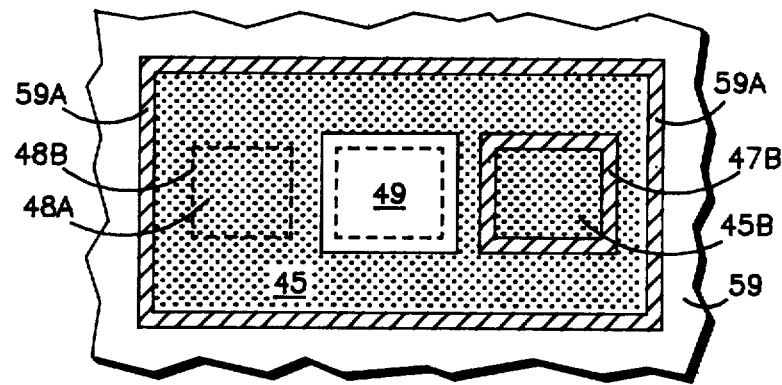
Figure 2D:
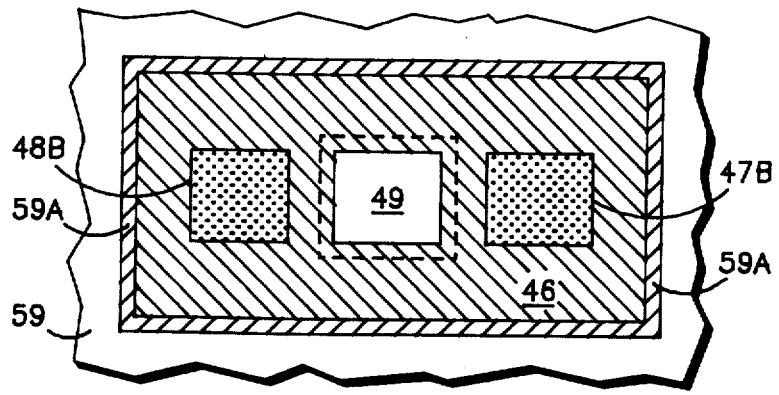

FIGS. 2B-D show, in simplified schematic form, planar cross-sectional views through the structure of FIG. 2A at different levels within the structure. For ease of understanding in FIGS. 2A-D, single crystal regions are shown as clear, dielectric regions are shown hatched, polycrystalline conductor regions are shown lightly stippled, and surface conductors are shown more heavily stippled. In FIGS. 2B-C, the locations of pillar or column portions 47b and 48b above lateral contact portions 47a and 48a are shown by dashed lines. Portion 59 of isolation wall 59-59a is shown as being single crystal but it could also be dielectric or polycrystalline or a combination thereof.

The structure of FIGS. 2A-D has reduced base-collector junction area and reduced collector-substrate junction area because single crystal active device region 49 need only be large enough to provide the necessary drive current and need not have additional area to accommodate planar contacts, since both base and collector contacts are made laterally by poly layers 43 and 45.

This combination of structural features reduces the parasitic capacity and series base resistance associated with the device and therefore permits improved performance with no increase in device area. It will be apparent to those of skill in the art that while the structure is illustrated in terms of a bipolar transistor having collector, base, and emitter, that other device types using buried lateral contacts can also be formed.

In the structure of FIGS. 2A-D the interfaces between poly regions 43, 45 and single crYstal region 49 may be recessed under the edges of dielectric layers 46 and 44, as shown, or may be flush with the edges of dielectric layers 46 and 44, as indicated by the vertical dashed lines in FIG. 2A. Recessing the single-poly interfaces separates them from the central portion of pillar 49 where device action primarily occurs. This results in improved device performance.

A further feature of the present invention is that conductor layer 45 is separated from poly pillar 47b by continuous dielectric layer portion 47c which extends from the device surface to conductor layer 43. Similarly, isolation from device to device is provided by continuous dielectric layer portion 59a extending from the device surface to substrate 41 or layer 42, irrespective of whether region 59 is conducting or insulating. Dielectric portions 47c and 59a are formed from the same material layer. The dielectric properties of this layer can be separately controlled independent of the properties of layers 43 and 45, and region 59. This is a feature of the present invention.

FIGS. 3A-I show cross-sectional views in simplified schematic form, but in greater detail, of the device of FIGS. 2A-D at different stages of fabrication, and according to a preferred embodiment. The fabrication sequence is illustrated as for an NPN bipolar transistor, but those of skill in the art will understand that other dopants could be used and that other devices or device types could equally well be fabricated following the principals taught herein with appropriate modifications of the doping types, locations, and mask shapes.

Figure 3A:
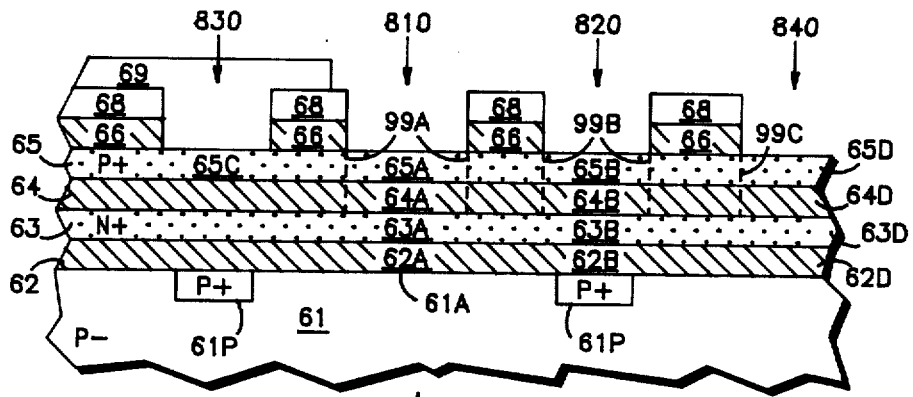
FIGS. 3A-I shows simplified schematic cross-sectional views of a portion of the semiconductor device of FIGS. 2A-D at different stages of fabrication according to a preferred embodiment.

As shown in FIG. 3A, device portion 60 comprises, for example, P-type substrate 61 having therein P+ channel-stop regions 61p. P+ channel-stop regions 61p play no part in the present invention and may be placed in different locations beneath or adjacent to device 60. Device portion 60 of FIG. 3A is analogous to device portion 40 of FIG. 2A. Substrate 61 is covered by dielectric layer 62, N+ polycrystalline conductor layer 63, dielectric layer 64, P+ polycrystalline conductor layer 65, and dielectric layer 66. Layers 62-66 are preferably deposited and/or formed sequentially without any intervening masking operations. This makes it possible to prepare layers 62-66 with a high degree of uniformity and perfection. This contributes substantially to obtaining a high manufacturing yield and is a feature of the present invention.

Dielectric layers 62, 64, and 66 must be electrical insulators. It is also important that dielectric layers 62, 64, and 66 be stable so as not to decompose or exude contaminants during formation of pillars 90 and 92 (see FIG. 3F). Further, layers 62 and 64 must act as diffusion barriers to prevent interdiffusion and shorting of conductor layers 63 and 65 and of substrate 61 during formation and subsequent processing. Dielectric layers 62, 64, and 66 may be of, for example, oxide, nitride, or combinations thereof, but other dielectric materials can also be used. Silicon oxide and silicon nitride or combinations thereof are preferred. Typical thicknesses are 0.02 to 0.5 microns for layer 62, 0.1 to 0.5 microns for layer 64, and 0.1 to 0.5 microns for layer 66, but other thicknesses can be used. Where substrate 61 is silicon, layer 62 is preferably 0.02 to 0.2 microns of grown silicon oxide covered with 0.2 to 0.3 microns of deposited silicon oxide or silicon nitride. Layer 64 is preferably 0.2 to 0.3 microns of deposited silicon oxide or silicon nitride or a combination thereof. Layer 66 is preferably 0.05 to 0.3 microns of silicon nitride covered with 0.05 to 0.3 microns of silicon oxide. Use of a sandwich construction for layer 62 is illustrated more fully in connection with FIGS. 4A–I. Use of a sandwich construction for layer 66 provides better deposition selectivity during subsequent epi/poly growth steps, and promotes a good epi-dielectric interface near critical junctions formed at or near the top of the epi pillar, as for example near the emitter-base junction of a bipolar transistor (see FIG. 3I).

Layers 63 and 65 must be of conductive materials sufficiently stable to withstand the processing required to form pillars 90 and 92 without introducing undesirable contamination into the semiconductor device region or without decomposing or melting. Doped polycrystalline silicon is suitable but other conductive materials such as for example metals, silicides or intermetallics can also be used, provided they have the above described properties. For doped polysilicon, thicknesses in the range 0.05 to 0.5 microns are suitable for layers 63 and 65, with 0.1 to 0.3 microns being preferred. Where it is desired, for example, to form an NPN vertical transistor or a PNP lateral transistor, it is convenient that layer 63 be N-doped or make ohmic contact to N material, and layer 65 be P-doped or make ohmic contact to P material. Layers 63 and 65 may serve as dopant sources for doping semiconductor regions which they touch. Those of skill in the art will understand how to select the conductivities and type for layers 63 and 65 in order for these layers to function as buried contacts and conductors with different device structures. Dielectric layers 62, 64, 66 and polycrystalline layers 63, 65 are formed by means well known in the art. Chemical vapor deposition, plasma assisted chemical vapor deposition, and sputtering are examples of suitable techniques for forming all or part of layers 62–66.

Dielectric layer 66 is covered by mask 68 in which are formed openings 810, 820, 830, and 840. Mask 68 is formed by means well known in the art. Openings 810–840 are used to etch corresponding openings 810–840 in dielectric layer 66, thereby exposing the upper surfaces of portions 65a–d of layer 65. Mask 68 with openings 810–840 constitutes a master mask, in the sense that openings 810–840 determine the location of the active device regions (e.g. emitter, base, collector) under opening 810, the external collector contact region under opening 820, the external base contact region under opening 830, the surrounding isolational region under opening 840, and buried conductor regions located between isolation regions (see FIGS. 5A–D). Accordingly, the important device regions are all self-aligned and self-registering. This is a feature of this embodiment of the present invention. Mask 68 may be left in place or removed, since its image has been transferred to layer 66 which can serve as the master mask for subsequent steps.

Figure 3B:
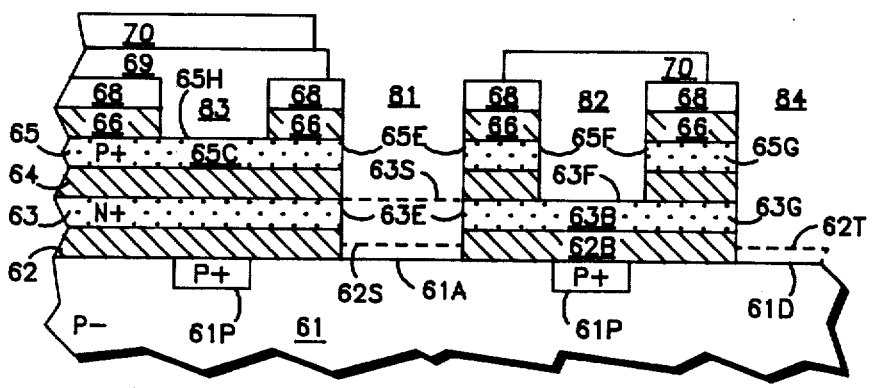

Mask 69 is provided so as to cover opening 830 above portion 65c of polycrystalline layer 65. Mask 69 does not require a precision alignment since its function is merely to block opening 830. Portions 65a, 65b and 65d of layer 65, and portion 64a, 64b, and 64d of layer 64 are removed as indicated by dashed lines 99a–c, so as to expose surface 63s and portions 63a, 63b, and 63d of polycrystalline layer 63 (FIGS. 3A–B). It is desirable that the above-noted portions of layers 64 and 65 be removed by anisotropic etching so as to produce relatively straight sided openings as indicated by dashed lines 99a–c. Reactive ion etching and ion milling are examples of suitable anisotropic etching techniques. Mask 69 may be removed or left in place.

Mask 70 is then applied covering hole 82 formed under opening 820 (FIG. 3B). Mask 70 may be applied without removing masks 68 and 69, or one or both may be removed prior to applying mask 70. If mask 69 is removed, then mask 70 must cover hole 83 formed under opening 830 as well as hole 82. Portions 63a and 63d of layer 63, and portions 62a and 62d of layer 62 are removed to expose portions 61a and 61d of substrate 61 under openings 810 and 840 (FIG. 3B). Alternatively, only part of portions 62a and 62d of layer 62 are removed so that some parts of layer 62 continue to remain above portions 61a and 61d, as indicated by dashed lines 62s and 62t (FIG. 3B).

Any remaining portions of masks 68, 69, and 70 are then removed. At this point in the process, the following openings have been created: hole 81 under opening 810 extending to substrate portion 61a or alternatively to level 62s of layer 62; hole 82 under opening 820 extending to surface 63f of layer 63; hole 83 under opening 830 extending to surface 65h of portion 65c of layer 65; and hole 84 under opening 840 extending to portion 61d of substrate 61 or, alternatively, to level 62t of layer 62. Edges or sides 63e and 65e of poly layers 63 and 65 are exposed in hole 81, edges or sides 63g and 65g of poly layers 63 and 65 are exposed in hole 84, surface 63f of layer 63 and edge or side 65f of layer 65 are exposed in hole 82, and surface 65h of layer 65 is exposed in hole 83. Portions 61a and 61d of substrate 61 are exposed in holes 81 and 84 respectively, or optionally covered with thin dielectric portions 62s and 62t.

Figure 3C:
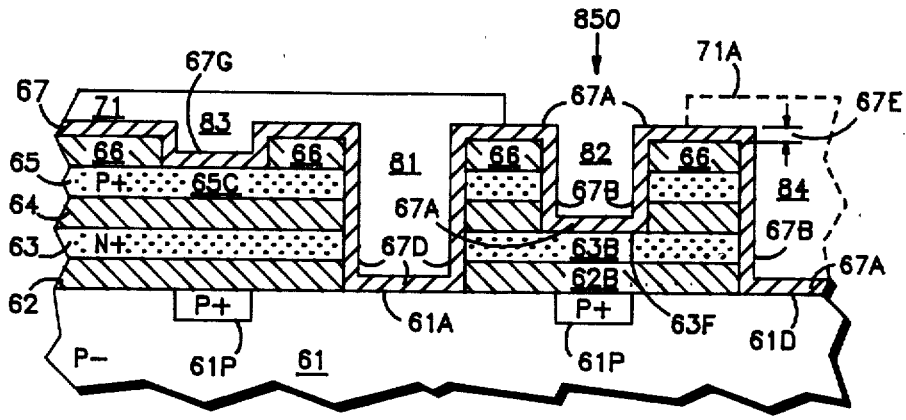
Figure 3D:
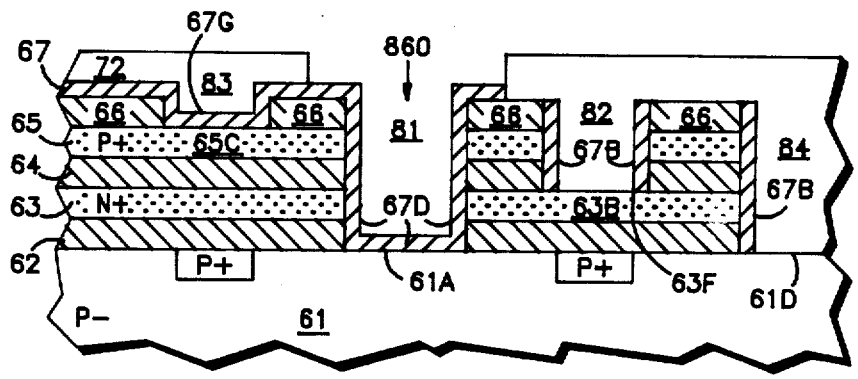

The structure with holes 81–84 is then conformally covered by dielectric layer 67 (FIG. 3C). As used herein, "conformal" is intended to mean having a substantially uniform thickness on the surface irrespective of whether the surface is horizontal, angled, or vertical. Layer 67 is desirably of silicon oxide, silicon nitride or combinations thereof having a thickness of 0.1–0.4 microns with about 0.2 microns of silicon oxide being preferred. Low pressure chemical vapor deposition is an example of a suitable conformal coating method. Other well known methods will also serve.

Portions 67a and 67d of layer 67 are removed while portions 67b and 67g are retained in place. This is conveniently accomplished in two steps using masks 71 and 72. Masks 71 and 72 may be applied in either order. It is preferable to use mask 71 first, i.e. before portions 67d are removed, since this avoids placing mask 71 directly on region 61a of substrate 61 and so avoids generating surface defects which can result from such contact. Surface defects would degrade the quality of the subsequent epi region grown on region 61a. The existence of surface damage in region 61d, by comparison, is of little consequence since no active device regions are formed above 61d.

Mask 71 is applied (FIG. 3C) to cover holes 81 and 83, and having opening 850 exposing holes 82 and (optionally) 84. Mask 71, need not be precision aligned and hole 850 may be larger than hole 82 and (optionally) larger than hole 84. Using mask 71, dielectric regions 67a in the bottom of hole 82 and on the device surface and, optionally, dielectric region 67a in the bottom of hole 84 are removed, without removing dielectric regions 67b on the sides of holes 82 and 84. This is conveniently accomplished using vertically directed anisotropic etching to remove thickness 67e of layer 67. This removes substantially all of portions 67a while leaving portions 67b substantially intact. Ion milling and reactive ion etching are suitable anisotropic etching techniques well known in the art.

Mask 71 may optionally include mask portion 71a covering hole 84, as indicated by the dashed lines in FIG. 3C. In this case, the above-described anisotropic etching steps removes dielectric region 67a in the bottom of hole 82 but leaves in place dielectric region 67a in the bottom of hole 84. As will be subsequently explained, this variation can be utilized, for example, when it is desired to subsequently fill hole 84 with dielectric material rather than a semiconductor material.

Mask 72 is applied (FIG. 3D) having opening 860 located above hole 81. Opening 860 may be larger than opening 810 and hole 81 and need not be precision aligned therewith since the function of mask 72 is to cover holes 82, 83, and 84. Using mask 72, dielectric regions 67d are removed, preferably by a mild dip etch or other form of isotropic selective etching, so as to produce the structure shown in FIG. 3E.

Figure 3E:
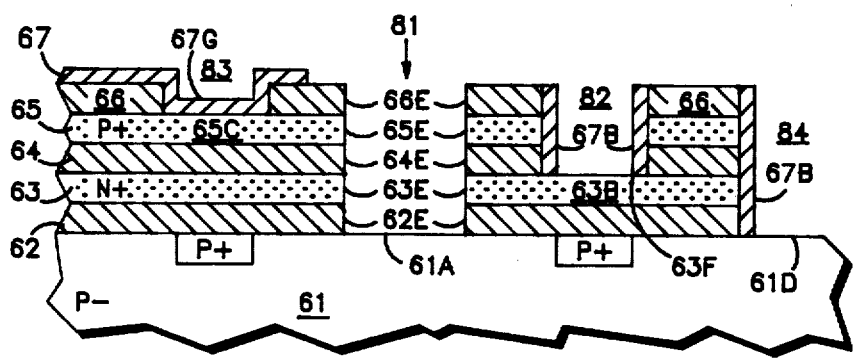

The process illustrated in FIGS. 3A-E produces hole 81 having substantially straight sides, i.e., edges 63e and 65e of conductor layers 63 and 65 are not recessed under edges 64e and 66e of dielectric layers 64 and 66. If recessed edges are desired, as shown for example in FIG. 2A, then prior to forming epi pillar 90 in FIG. 3F, the configuration of FIG. 3E is subjected to a brief selective etch of conductor edges 63e and 65e. This produces the recessed shape shown in corresponding layers 43 and 45 of FIG. 2A. Means for selectively etching conductors in preference to dielectrics are well known in the art. Recessed poly conductor edges are desirable since this configuration keeps the epi-poly interface back under edges 64e and 66e so that the dislocated semiconductor material at the poly-epi interface does not disturb device operation in single crystal pillar 49 (FIGS. 2A-D) or 90 (FIGS. 3F-I). For simplicity however, the recessed feature has been omitted from single crystal pillar 90 in FIGS. 3F-I and 4F-I. Those of skill in the art will understand that a recess step may be applied equally well to the process illustrated in FIGS. 3E-I and 4E-I.

Any remaining portions of masks 71 and 72 are removed (FIG. 3E). At this point in the process, hole 83 extends to dielectric region 67g, hole 81 extends to region 61a of substrate 61, hole 82 extends to surface 63f of poly layer 63, and hole 84 extends to dielectric region 62t and/or 67a, or to region 61d of substrate 61.

Figure 3F:
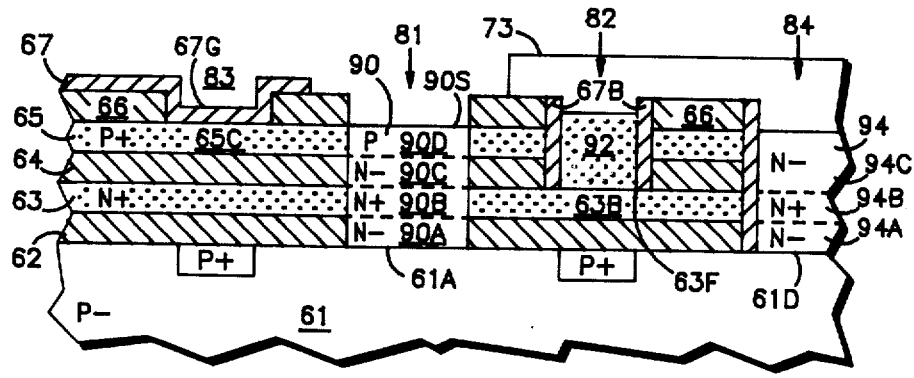

The partially completed device is placed in a epitaxial reactor or other suitable apparatus and exposed to a semiconductor bearing gas or particle stream under conditions suitable for the growth of single crystal region 90 above portion 61a of substrate 61, optional single crystal region 94 above portion 61d of substrate 61, and polycrystalline region 92 on surface 63f above region 63b of polycrystalline layer 63 (FIG. 3F). The epitaxial growth conditions are preferably adjusted so that significant nucleation does not take place on the exposed dielectric surfaces, i.e. on layer 66, region 67g in hole 83, the remaining portions of layer 67, and, if present, regions 62t and/or 67a in hole 84. FIG. 3F illustrates the situation where dielectric regions 62t and/or 67a have been removed from hole 84 and portion 61d exposed.

To form an NPN bipolar transistor, it is desirable that substrate 61 be P-type and that deposited regions 90, 92, and 94 by N-type. This is conveniently accomplished by providing N-type doping during the growth of single crystal regions 90, 94 and polycrystalline region 92. By adjusting the growth conditions, polycrystalline region 92 may be made to grow more slowly or more rapidly than single crystal regions 90, 94. In the example shown in FIG. 3F, conditions are adjusted so that polycrystalline region 92 grows slightly more slowly than single crystal regions 90 and 94 so that the upper surfaces of single crystal regions 90, 94 and polycrystalline region 92 are reasonably level after growth is completed. Exact coincidence is not required. It has been found that epitaxial growth using a mixture of dichlorosilane at 300-800 cc/min, hydrogen at 120-180 l/min, and hydrogen chloride at 1-2% of the hydrogen rate, at 925-1050 degrees C., gives a silicon growth rate of 0.05-0.3 microns/min with a poly to single crystal growth rate ratio of about 0.6-0.8 to 1. A hydrogen prebake at about 50 Torr at 1000-1100 degrees C. is desirable.

It desirable but not essential that the doping be varied during growth of regions 90, 92 and 94 so as to first form N- regions 90a 94a, then N+ regions 90b, 94b, then N— regions 90c and 94c. N— region 90c may extend to surface 90s of epitaxial pillar 90. P region 90d is formed in the upper portion of epitaxial pillar 90, preferably by ion implantation after completion of epi growth, in connection with mask 73 (FIG. 3F). However, P-type region 90d may also be formed by introducing P-type dopants during the final stages of the epitaxial growth process, but this is less desirable.

Holes 81, 82, and 84 need not be completely filled by semiconductor pillars 90, 92, and 94, respectively (FIG. 3F). It is only necessary that surface 90s of epitaxial pillar 90 extend to or above the level of P+ polycrystalline layer 65 so that contact is obtained at the periphery of epitaxial pillar 90 between P region 90d and P+ lateral poly contact 65. Where ion implantation is used to create P-type region 90d, mask 73 (FIG. 3F) is used to avoid P-type doping of poly region 92 or single crystal region 94. It does not matter whether region 65c of P+ poly layer 65 below hole 83 is doped during formation of P-type region 90d. Also it does not matter whether single crystal region 94 is doped during this step.

Figure 3G:
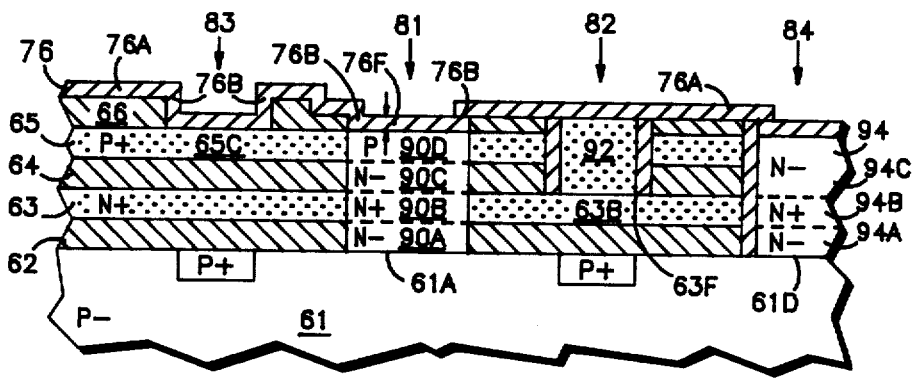

Dielectric region 67g at the bottom of hole 83 is then removed (FIG. 3G). This may be conveniently accomplished by dip or blanket etching which may be performed either before or after removal of mask 73. An additional masking step is not required. The etching process should desirably be selective so as to attack dielectric regions in preference to semiconductor regions. Such techniques are well known in the art. Some etching of the upper part of layer 66 can also occur without harm.

Following removal of dielectric region 67g, a conductor layer (not shown) may be applied and delineated to provide emitter, base and collector contacts. By using doped poly, the emitter contact can act as a diffusion source to provide the emitter region. However, an improved device is formed by following the procedure illustrated in FIGS. 3G-I.

Figure 3H:
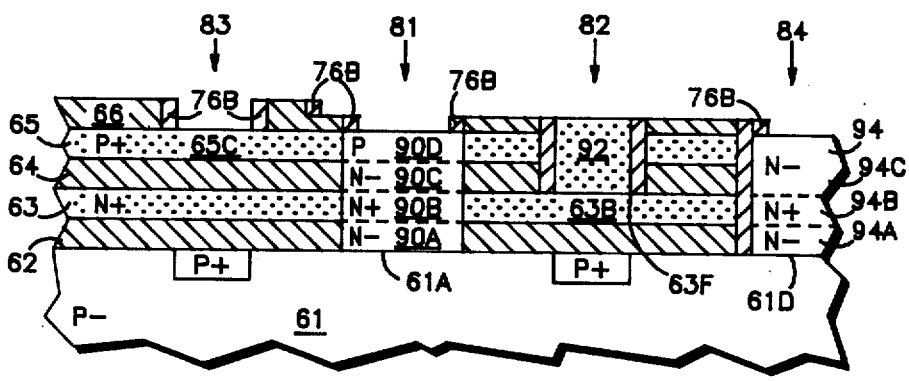

In FIG. 3G, the structure resulting after the removal of mask 73 and dielectric region 67g is conformally covered by substantially uniform dielectric layer 76. Dielectric layer 76 is conveniently of silicon oxide or nitride or combinations thereof about 0.1–0.5 microns thick. However, other dielectrics and thickness can also be used. Dielectric layer 76 has portion 76a over the remaining part of layer 66 and single crystal region 90, and portion 67b at the steps or corners formed between layer 66, single crystal region 90 and poly region 65c. Layer 76 is anisotropically etched to remove thickness 76f. This removes portions 76a but leaves behind portions 76b at the edge of openings 810, 830 and 840 in dielectric layer 66 (FIG. 3H). This provides a lateral dielectric spacer at the edge of the openings in layer 66.

Figure 3I:
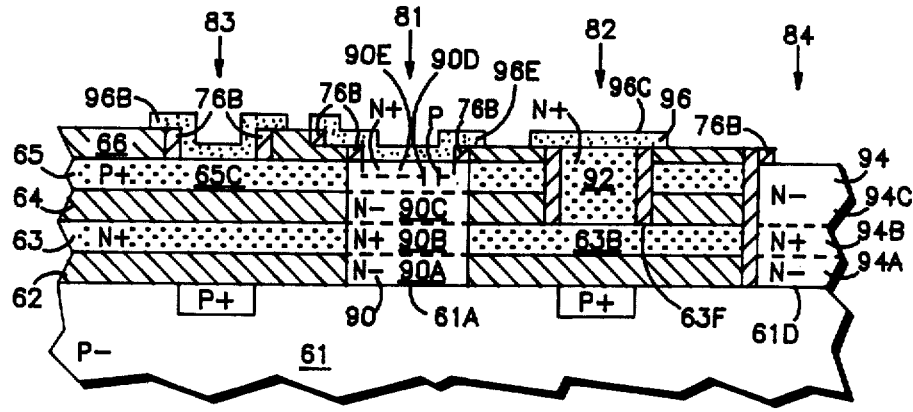

FIG. 3H illustrates the situation when base region 90d is formed by implantation before the formation of lateral dielectric spacer 76b. Mask 73 was employed in this process to limit the P-type implant to single crystal region 90. However, that is not essential. P-type region 90d could equally well have been formed after the formation of the lateral dielectric spacer. Lateral dielectric spacer 76b insures that emitter region 90e will be placed in the center of epitaxial region 90 away from the interface between P+ poly region 65 and P-type base region 90d (FIG. 3I).

Layer 96 is applied and delineated to provide emitter contact 96e base contact 96b, and collector contact 96c. Layer 96 may be of any suitable conductor, e.g. polycrystalline silicon, silicide, metal, intermetallic, or other semiconductor. Emitter region 90e is formed in P region 90d by any convenient method. This may be conveniently accomplished for example, by out-diffusion of N+ dopant from portion 96e of poly layer 96. Means for N doping of portions 96c and 96e, and P doping of portion 96b of layer 96 are well known in the art, as for example, by providing a mask (not shown) to cover portion 96b and using N-type implant into portions 96c and 96e, and then providing a mask (not shown) to cover portions 96c and 96e, and providing a P-type implant into region 96b. Such techniques are well known. Other methods may also be used. These masking steps need not involve precision alignments since the location of emitter 90e is determined substantially by the location of opening 810 and lateral spacer 76b.

If it is desired to incorporate a diode in series, for example, with conductor 63, portion 96c of layer 96 may be made strongly P-type. In this situation, a PN junction is formed in the body of poly pillar 92. Such an arrangement is particularly useful with high speed bipolar logic where a diode forms the load device. By providing two poly pillars 92 coupled to collector region 90a–c by poly layer 63, a first poly pillar with a P+ contact to form the diode and a second poly pillar with an N+ contact, contact may be made directly to collector region 90a–c of device pillar 90 via the N+ contact, and to the series PN diode via the P+ contact.

In connection with FIG. 3C it was explained that by including portion 71a in mask 71, that dielectric region 62t and/or 67a was retained in the bottom of hole 84. When epitaxial semiconductor regions 90 and 92 are formed with that structure, using the techniques described in connection with FIG. 3F, hole 84 remains substantially free of semiconductor material. This is because epitaxial growth is arranged using means well known in the art so that there is little or no nucleation on dielectric surfaces. Hole 84 can then be filled with a dielectric. This may be accomplished by use of spin-on glasses, poly deposition and oxidation, or other means well known in the art.

Figure 4A:
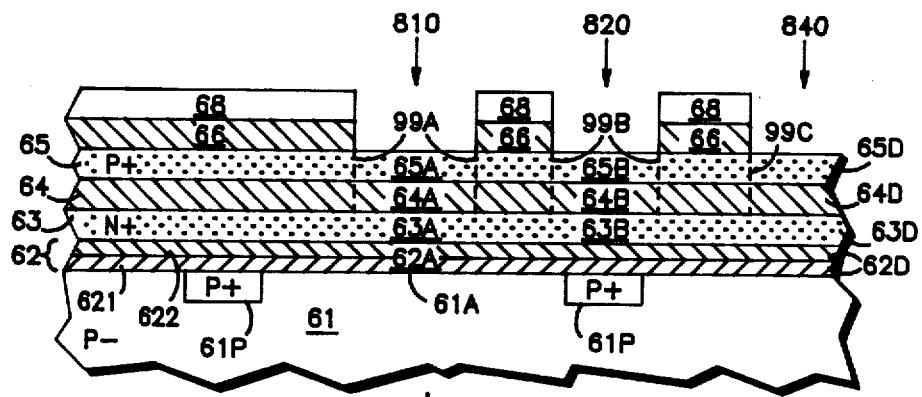
FIGS. 4A-I shows simplified schematic cross-sectional views of a portion of the semiconductor device of FIGS. 2A-D at different stages of fabrication according to a further embodiment.
Figure 4B:
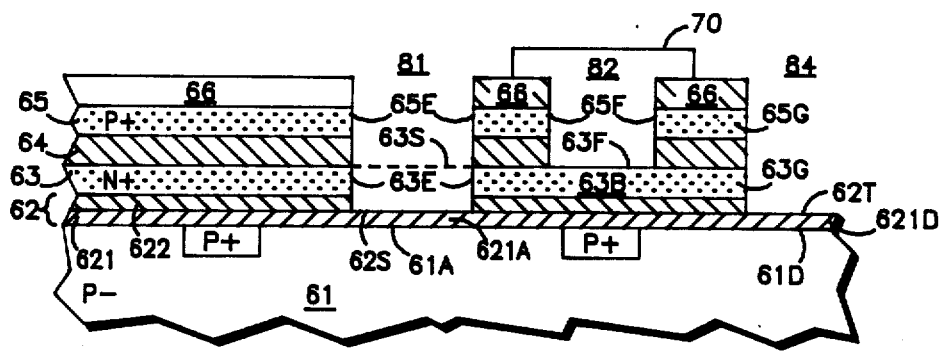
Figure 4C:
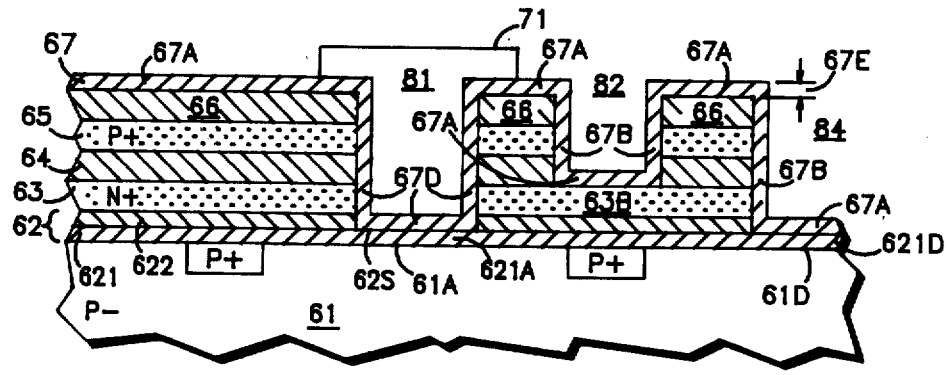
Figure 4D:
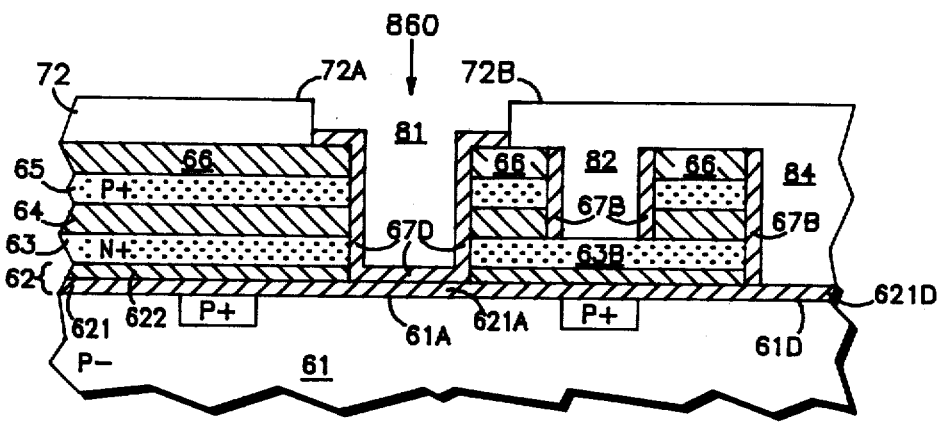

FIGS. 4A-I show cross-sectional views similar to FIGS. 3A-I of the device of FIGS. 2A-D during different stages of fabrication, according to a further embodiment of the present invention. Substrate 61 and layers 62–66 are similar to those discussed in connection with FIG. 3A except that the sandwich construction of layer 62 is particularly illustrated. Layer 62 comprises lower portion 621, preferably of silicon oxide and upper portion 622 preferably of silicon nitride. The thickness are as previously stated in connection with FIG. 3A. A further variation is illustrated in FIG. 4A in which mask 68 serves the same function as in FIG. 3A, but lacks opening 830. Holes 81, 82, and 84 are formed in FIGS. 4A-B in the same manner as for holes 81, 82, and 84 in FIGS. 3A-B, except that FIGS. 4A-B illustrate the situation where etching is stopped at surface 62s of portion 621 of layer 62 in hole 81. This is readily accomplished by chosing layers 622 and 621 have different etching characteristics. Layer 67 and mask 71 are applied in FIG. 4C in the same manner as in FIG. 3C, and serve the same function. Portions 67a of layer 67 are removed, leaving portions 67b. FIG. 4D illustrates the situation where portion 621d is left in place above portion 61d of substrate 61. However, portion 621d may also be removed.

Figure 4E:
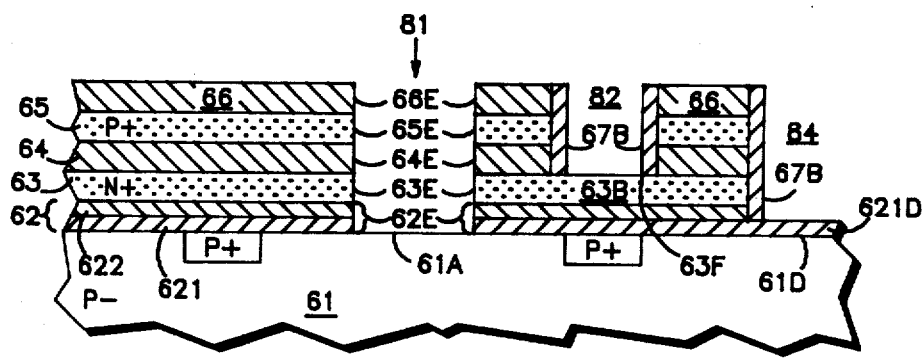
Figure 4F:
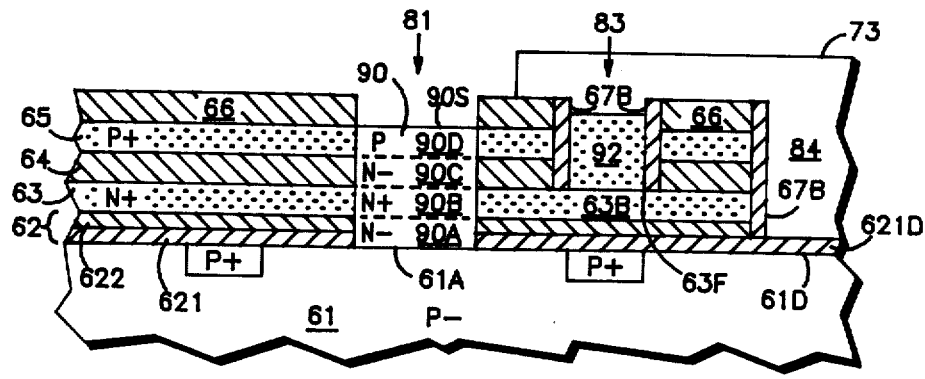
Figure 4G:
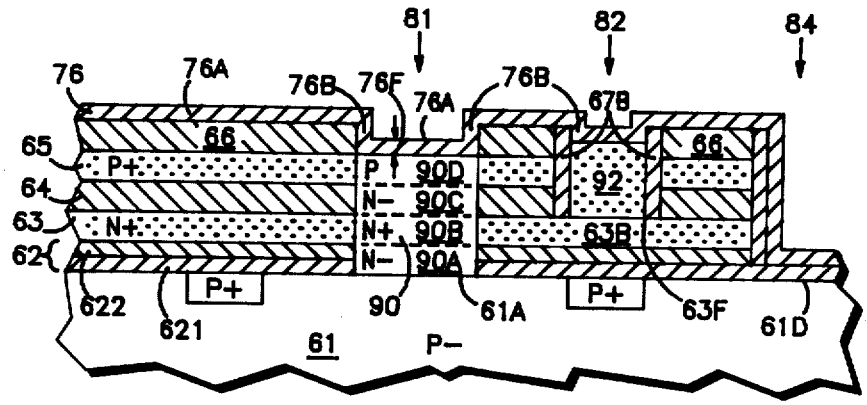
Figure 4H:
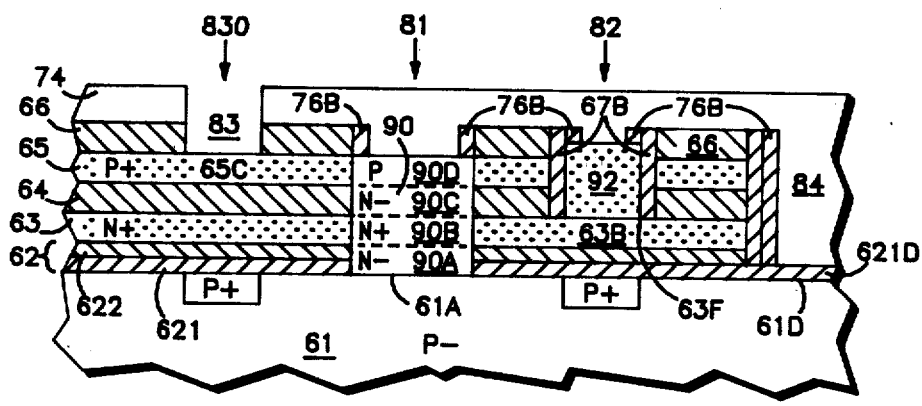

Proceeding in a manner analogous to FIG. 3OD-E, mask 72 is applied and portions 67d of layer 67 removed (FIGS. 4D-E). Portion 621a is also removed to expose portion 61a of substrate 61. Semiconductor pillars 90 and 92 are formed and doped (FIG. 4F) in the same way as described in connection with FIG. 3F. Semiconductor pillar 94 (see FIG. 3F) does not form in FIG. 4F since region 61d is covered with dielectric portion 621d. Under the preferred growth conditions, the semiconductor material does not substantially nucleate on the dielectric. Layer 76 is applied and etched to form lateral spacers 76b in FIGS. 4G-H, in substantially the same way as was used in connection with FIGS. 3G-H.

Figure 4I:
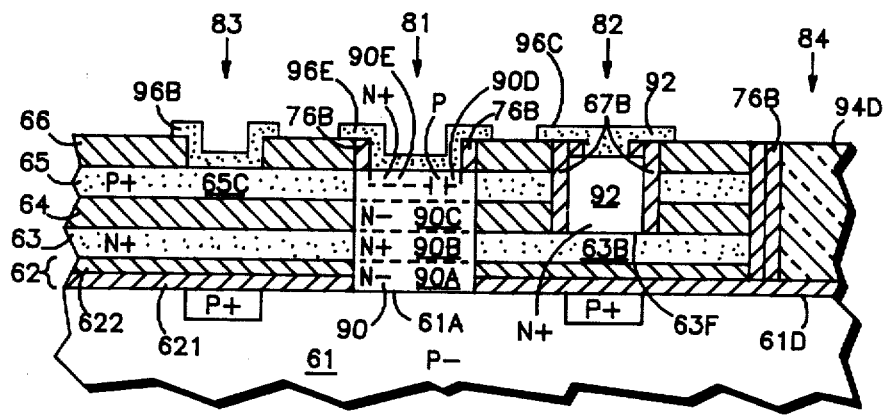

Unlike the process of FIGS. 3A-H, the process of FIGS. 4A-H does not automatically provide contact hole 83 since opening 830 was omitted from mask 68. Hence mask 74 is required (FIG. 4H) with opening 830 for providing hole 83 extending through layer 66 to expose portion 65c of layer 65. Hole 83 may be opened before or after deposition of layer 76. The completed device is illustrated in FIG. 4I. Contacts 96c, 96e and 96b, and emitter 90e are formed in substantially the same manner as for FIG. 3I. Emitter 90e may be formed before or after opening hole 83. FIG. 4I further illustrates the situation where hole 84 has been filled by dielectric region 94d. This may be accomplished using spin on glasses or other means well known in the art.

Figure 5A:
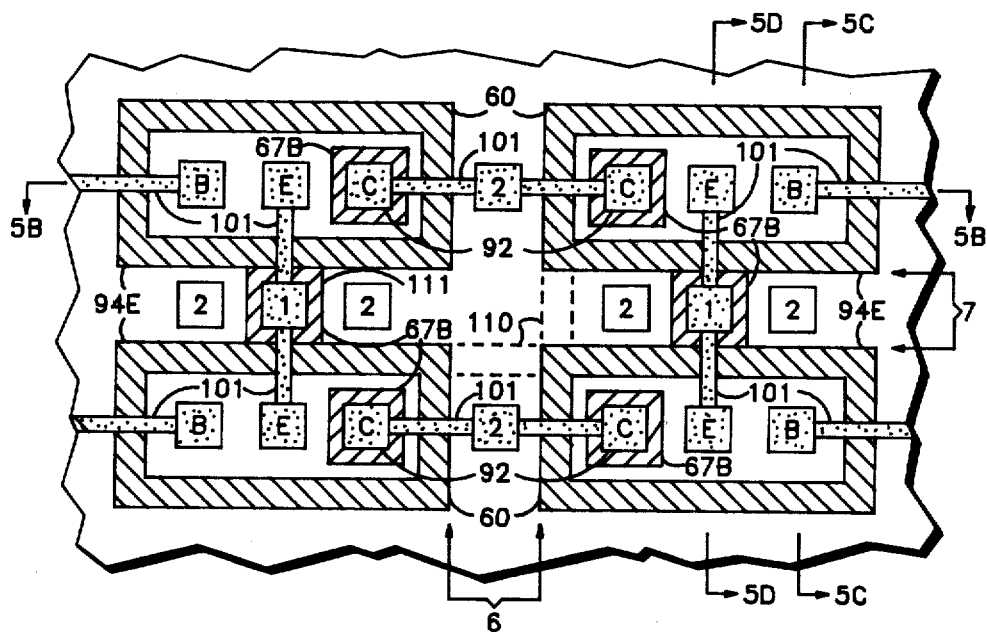
FIGS. 5A-D show simplified schematic plan and side cross-sectional views of an array of interconnected devices according to the present invention.
Figure 5B:
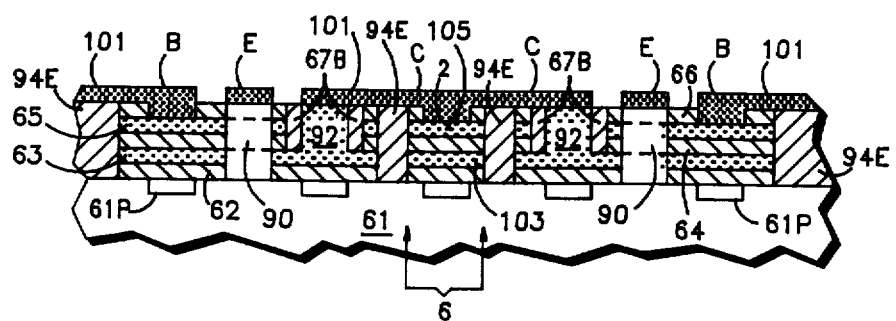
Figure 5C:
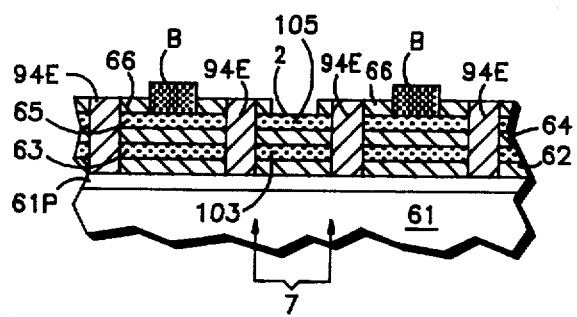
Figure 5D:
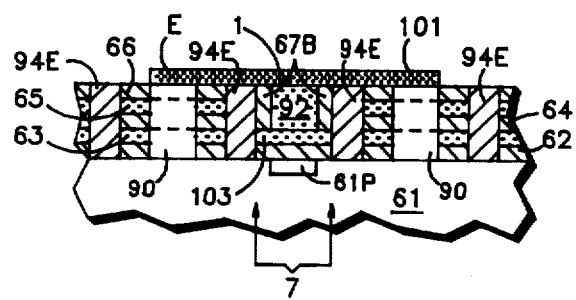

FIGS. 5A-D show in simplified schematic form a plan view (FIG. 5A) and cross-sectional views (FIGS. 5B-D) of interconnected array 100 of devices 60 similar to device 40 of FIGS. 2A-D and/or device 60 FIGS. 3A-I or 4A-I, showing how the means and method of the present invention can be used to automatically provide isolated buried self-aligned wiring channels between individual devices 60. For clarity, some details of the individual devices have been omitted in FIGS. 5A-D. Isolation walls 94e correspond to the several alternative shown in FIGS. 2A-D, 3A-I, and/or 4A-I. The array is illustrated for bipolar devices having emitter contact E, base contact B, and collector contact C. Collector contact C may be of the types illustrated in FIGS. 3I or 4I, and may be with or without a series diode. Isolation walls 94e surround each device 60 and isolation regions 67b surround each poly pillar 92 and are cross-hatched for clarity. Buried poly layers 63 and 65 are lightly stippled. Surface interconnections 101 are more heavily stippled and may be semiconductor, inter-metallic, metal, semi-metal or a combination thereof. The number 1 indicates the locations where surface contacts are or can be made to layer 63 and the number 2 indicates the locations where contacts are or can be made to layer 65. Other contact locations are also possible. FIGS. 5B-D show cross-sections through FIG. 5A at various locations.

Four devices 60, each surrounded by isolation walls 94e are arranged, in this example, in a rectangular array separated by wiring channels 6-7. Collectors C of each device 60 are connected to buried poly conductor portions 105 of layer 65 at locations 2 in wiring channel 6, as can be seen in FIGS. 5A and 5B. Emitters E are connected to buried poly conductor portions 103 of layer 63 at locations 1 in wiring channel 7, as can be seen in FIGS. 5A and 5D. Connections 1 or 2 to layers 63 or 65, respectively, may be brought to the surface at any desired point in either wiring channel. Connection points 1 are formed at the same time and by the same procedure as for forming poly pillar 92 in FIGS. 3F-I or 4F-I. Connection points 2 are formed at the same time and in the same way as connections to region 65c in FIGS. 3F-I or 4F-I. Each layer in the wiring channels may be contacted independently. Wiring channels 6-7 may be made wider or smaller depending on how many connections are desired. Also portions 103 and 105 of layers 63 and 65 may run continuously through wiring channels 6-7 or may be interrupted by extending isolation walls 94e, as at 110. Upper layer 63 may be interrupted, as at 111, by extending a poly pillar and its surrounding isolation wall 67b entirely across the wiring channel. A feature of the above-described means and method is that some or all of the wiring channels and contacts thereto, the isolation walls, and the devices and contacts thereto may be made self-aligned and self-registering. This makes possible extremely compact layouts. The arrangement illustrated in FIGS. 5A-D provides an extremely flexible and compact interconnection arrangement for complex integrated circuits.

Having thus described the invention it is apparent that the present invention provides a means and method for constructing isolated devices on a common semiconductor substrate which have minimum parasitic junction areas and further which have multiple lateral sidewall device contacts which are isolated from each other and from the substrate by dielectric regions rather than merely by PN junctions. Further, the described means and methods provides a structure which may be self-aligned and self-registering in which some or all device and buried connection and contact areas are defined by single masking layer. The described means and method is particularly suitable for use in high density integrated circuits.

While the invented process has been illustrated in terms of particular combinations of conductivity and device types, those of skill in the art will recognize that these are merely intended to be illustrative, and that the invented means and method can be used in connection with other combinations of conductivity types and other types of devices. For example, but not limited thereto, the means and method of the present invention can be used to make diodes, bipolar transistors, thyristors, lateral transistors, field effect devices, resistors, capacitors, and multi-layer interconnections. Accordingly, it is intended to include all such variations within the claims which follow.

We claim:

1. A process for forming a sidewall contact semiconductor device comprising:

providing a semiconductor substrate;

forming on said substrate, and without masking operations, substantially continuous superposed layers of a first dielectric, a first polycrystalline conductor, a second dielectric, a second polycrystalline conductor and a third dielectric, wherein the third dielectric has an outer surface;

forming on the outer surface a first mask having first, second and third openings above first, second and third portions respectively of each of the substrate, the first, second and third dielectric layers and the first and second polycrystalline conductor layers;

exposing first edge portions of the first and second polycrystalline conductor layers and the second and third dielectric layers beneath the first opening, the second portion of the first polycrystalline conductor layer and second edge portions of the second polycrystalline conductor layer and second and third dielectric layers beneath the second opening, and the third portion of the seond polycrystalline conductor layer beneath the third opening;

conformally covering the structure with a fourth dielectric layer;

covering the fourth dielectric layer with a further mask having a fourth opening encompassing the second opening;

anisotropically etching the portion of the fourth dielectric layer exposed in the fourth opening so as to remove the portion of the fourth dielectric layer above the second portion of the first polycrystalline conductor layer while not substantially removing the portion of the fourth dielectric layer on the second edge portion of the second polycrystalline conductor layer;

covering the fourth dielectric layer with an additional mask having a fifth opening encompassing the first opening;

isotropically etching the portion of the fourth dielectric layer exposed in the fifth opening so as to remove at least the portions of the fourth dielectric layer on the first edge portions of the first and second polycrystalline conductor layers and on the first portion of the substrate;

then forming a single crystal semiconductor pillar above the first portion of the substrate and in contact with the first edge portions of the first and second polycrystalline conductor layers, and forming a polycrystalline conductor pillar above and in contact with the second portion of the first polycrystalline conductor layer;

forming a device in the single crystal semiconductor pillar; and providing electrical connections to the third portion of the second polycrystalline conductor layer, the single crystal semiconductor pillar and the polycrystalline pillar.

2. The process of claim 1 wherein said exposing step comprises:

using the first, second and third openings of the first mask, removing first, second and third portions, respectively, of the third dielectric layer to create first second and third openings therein, respectively;

forming a second mask covering the third opening and removing the first and second portions of the second polycrystalline conductor layer and second dielectric layer under the first and second openings; and providing a third mask covering the second opening and removing the first portion of the first polycrystalline conductor layer and the first portion of the first dielectric layer under the first opening.

3. The process of claim 1 further comprising:

providing a first type doping in a lower portion of the single crystal pillar to form a first doped region in contact with the first polycrystalline conductor layer;

providing a second type doping in a middle portion of the single crystal pillar to form a second doped region in contact with the second polycrystalline conductor layer; and providing a third type doping at an upper surface of the single crystal semiconductor pillar to form a third doped region.

4. The process of claim 1 further comprising:

providing an isolation region by including in the first mask a first isolation opening which surrounds the device and the first, second and third openings; extending the first isolation opening at least to the first dielectric layer; conformally coating the isolation opening with the fourth dielectric layer; exposing the bottom of the isolation opening while leaving in place the portion of the fourth dielectric layer on the sides of the isolation opening; and refilling the isolation opening substantially to the surface of the third dielectric layer with a dielectric or semiconductor material.

5. A process for forming buried interconnections for semiconductor devices comprising:

providing a semiconductor substrate having thereon a first dielectric layer;

forming with intervening masking steps at least two insulated buried substantially continuous unpatterned horizontal conductor layers separated by one or more substantially continuous unpattern dielectric layers on the first dielectric layer on the substrate;

etching cavities through the at least two insulated buried horizontal conductors;

filling first cavities with a single crystal semiconductor material contacting first portions of the first and second buried horizontal conductors on the side of the first cavities;

filling second cavities with polycrystalline conductor material contacting the first buried horizontal conductor and insulated from the second horizontal conductor; and providing spaced apart isolation walls penetrating through the first annd second horizontal conductors for isolating individual devices formed in the single crystal semiconductor material in the first cavities, leaving channels between the isolation walls, and leaving segments of the first and second polycrystalline conductor layers in the channels as interconnections for coupling together some isolated devices.

6. A process for forming sidewall contact semiconductor devices comprising:

providing a semiconductor substrate;

forming on said substrate, and without patterning steps, continuous superposed layers comprising a first layer of a first dielectric, a first layer of a first polycrystalline conductor, a second layer of a second dielectric, a second layer of a second polycrystalline conductor, and a third layer of a third dielectric having an outer surface;

forming on said outer surface a first masking layer having first, second and third openings above first, second and third portions, respectively, of each of said substrate, said first, second and third dielectric layers and said first and second polycrystalline conductor layers;

removing said first, second and third portions of said third dielectric layer exposing said first, second and third portions of said second polycrystalline conductor layer;

forming a second masking layer covering said third portion of said second plycrystalline conductor layer;

removing said first and second portions of said second polycrystalline conductor layer and second dielectric layer exposing said first and second portions of said first polycrystalline conductor layer;

providing a third masking layer covering said second portion of said first polycrystalline conductor layer;

removing said first portion of said first polycrystalline conductor layer and said first portion of said first dielectric layer;

wherein first edge portions of said first and second polycrystalline layers are exposed under said first opening and second edge portions of said second polycrystalline layer and said second portion of said first polycrystalline layer are exposed under said second opening;

applying a conformal coating of a fourth dielectric layer to said third dielectric layer and said exposed edges and portions;

then in either order, (a) providing a fourth masking layer having a fourth opening larger than said second opening and above said second portion of said first polycrystalline conductor layer and anisotropically etching through said fourth opening to remove a portion of said fourth dielectric layer on said second portion of said first polycrystalline conductor layer while substantially leaving in place a portion of said fourth dielectric layer on said second edge portion of said second polycrystalline conductor layer, and (b) providing a fifth masking layer having a fifth opening layer than said first opening and above said first portion of said substrate and isotropically etching a portion of said fourth dielectric layer exposed through said fifth opening to expose said first portion of said substrate and said first edge portions of said first and second polycrystalline conductor layers;

then forming a single crystal semiconductor region above said first portion of said substrate and in contact with said first edge portions of said first and second polycrystalline conductor layers;

forming a polycrystalline conductor contact region above said second portion of said first polycrystalline conductor layer;

forming a device in said single crystal semiconductor region; and forming electrical connections to said third portion of said second polycrystalline conductor region, said single crystal region, and said polycrystalline conductor contact region.

7. The process of claim 6 wherein said step of forming a device in said single crystal semiconductor region comprises doping an upper portion of said single crystal region with first dopant in contact with said edge portion of said second polycrystalline conductor layer and thereafter doping said upper portion of said single crystal semiconductor region with a second dopant different than said first dopant and to a shallower depth.

8. The process of claim 7 wherein said step of forming a single crystal semiconductor region or said step of forming a device in said single crystal region further comprises doping said single crystal region in contact with said edge portion of said first polycrystalline conductor layer with a dopant of said second type.

* * * * *

UNITED STATES PATENT AND TRADEMARK OFFICE
CERTIFICATE OF CORRECTION

PATENT NO. : 4,696,097

DATED : September 29, 1987

INVENTOR(S) : Kevin L. McLaughlin et al.

It is certified that error appears in the above-identified patent and that said Letters Patent is hereby corrected as shown below:

Column 14, Claim 1, line 29, change "seond" to -- second --.

Column 15, Claim 5, line 44, replace "with" by -- without --.

Column 15, Claim 5, line 47, replace "unpattern" by -- unpatterned --.

Column 15, Claim 5, line 54, replace "side" by -- sides --.

Column 15, Claim 5, line 61, replace "annd" by -- and --.

Column 16, Claim 6, line 22, change "plycrystalline" to -- polycrystalline --.

Column 16, Claim 6, line 55, change "layer" (second occurrence) to -- larger --.

Signed and Sealed this

Twenty-sixth Day of April, 1988

*Attest:*

DONALD J. QUIGG

*Attesting Officer*   *Commissioner of Patents and Trademarks*